US007992800B2

(12) United States Patent
Hsieh et al.

(10) Patent No.: US 7,992,800 B2
(45) Date of Patent: Aug. 9, 2011

(54) NEBULIZATION APPARATUS WITH A PACKAGING AND FIXING STRUCTURE

(75) Inventors: Shu-Pin Hsieh, Taipei (TW); Chien-Hua Lin, Taipei (TW); Chang-Wei Lin, Kaohsiung (TW); Andy Meng, Taipei (TW); Yu-Chung Hsu, Taipei (TW); Mei-Hui Huang, Tainan (TW); Chia-Chen Huang, Kaohsiung County (TW); Chieh-Ming Hsiung, Taoyuan County (TW); Liang-Wei Liu, Taipei (TW)

(73) Assignee: Micro Base Technology Corporation, Taoyuan Hsien (TW)

( * ) Notice: Subject to any disclaimer, the term of this patent is extended or adjusted under 35 U.S.C. 154(b) by 186 days.

(21) Appl. No.: 12/352,502

(22) Filed: Jan. 12, 2009

(65) Prior Publication Data

US 2010/0072299 A1 Mar. 25, 2010

(30) Foreign Application Priority Data

Sep. 25, 2008 (TW) ................................ 97136991 A

(51) Int. Cl.
*B05B 1/08* (2006.01)
*B05B 17/06* (2006.01)
*H01L 41/053* (2006.01)

(52) U.S. Cl. ..................... 239/102.2; 239/600; 310/345; 310/348

(58) Field of Classification Search ........... 239/4, 102.1, 239/102.2, 338, 600; 310/311, 328, 340, 310/344, 345, 348; 128/200.14, 200.16
See application file for complete search history.

(56) References Cited

U.S. PATENT DOCUMENTS

| | | | | |
|---|---|---|---|---|
| 5,297,734 | A * | 3/1994 | Toda | 239/102.2 |
| 5,657,926 | A * | 8/1997 | Toda | 239/102.2 |
| 6,854,662 | B2 * | 2/2005 | Chen | 239/102.2 |
| 6,915,962 | B2 * | 7/2005 | Power et al. | 239/102.2 |
| 2008/0041972 | A1 * | 2/2008 | Chen et al. | 239/102.2 |

FOREIGN PATENT DOCUMENTS

| | | |
|---|---|---|
| TW | 566339 | 12/2003 |
| TW | I252130 | 4/2006 |

* cited by examiner

*Primary Examiner* — Darren W Gorman

(74) *Attorney, Agent, or Firm* — WPAT, P.C.; Anthony King

(57) ABSTRACT

A nebulization apparatus with a packaging and fixing structure includes a piezoelectric driving device, an adhesive agent, a nebulization plate, a packaging layer and a fixing base. A ditch at the piezoelectric driving device is provided for filling an adhesive agent and installing the nebulization plate that is fixed to the driving device by the adhesive agent. The packaging layer covers the piezoelectric driving device. The fixing base fixes the piezoelectric driving device. Preferably, the packaging layer is made of a polymer material for insulating moisture and preventing short circuits of the piezoelectric driving device. The ditch and the adhesive agent enhance the attaching strength of the piezoelectric driving device and the nebulization plate to extend the life of the nebulization apparatus, and the adhesive agent can electrically insulate the nebulization plate and the piezoelectric driving device, such that the nebulization plate will have no electrochemical action with the liquid.

9 Claims, 11 Drawing Sheets

NEBULIZATION APPARATUS WITH A PACKAGING AND FIXING STRUCTURE

BACKGROUND OF THE INVENTION

1. Field of the Invention

The present invention relates to a nebulization apparatus with a packaging and fixing structure, and more particularly to a nebulization apparatus with a packaging layer covered onto the surface of a piezoelectric driving device to prevent any short-circuit of nebulization apparatus caused by the contact of the piezoelectric driving device with a liquid level.

2. Description of the Related Art

As the demand of air fresheners and aerosol medicines increases, the need for a nebulization apparatus to nebulize air freshener solutions and medicine solutions increases accordingly. In addition to the applications for air fresheners and aerosol doses, the nebulization apparatus also provides an indoor moistening effect for countries and regions having a dry weather. Manufacturers and researchers put up lots of investments and efforts in this area, in hope of improving the nebulization efficiency and lowering the production cost.

The working principle of a traditional liquid nebulization apparatus uses a high-frequency vibrator material (such as a piezoelectric driving device) installed in a liquid to generate vibrations to destroy the surface tension of the liquid and produce molecules of the liquid, or installs a micro-nozzle nebulization plate on a side or in the vibrator for exciting the liquid in waveforms to produce molecules of the liquid, so as to achieve the nebulization effect.

FIG. 1 illustrates the method of connecting a nebulization plate and a piezoelectric driving device in a conventional nebulization apparatus. The glue 12 is used to attach a micro-nozzle nebulization plate 11 with a piezoelectric driving device 13, such that the micro-nozzle nebulization plate 11 is driven by the piezoelectric driving device 13 to produce an inertia movement for a nebulization effect. However, a compression or a pulling stress produced by the inertia movement of the micro-nozzle nebulization plate 11 and exerted onto the glue 12 will damage the adhesiveness of the glue 12 after such nebulization apparatus has been operated for a long time, and thus a crack 14 of the glue 12 will be produced at the position of a free end proximate to the micro-nozzle nebulization plate 11 by the compression and pulling stress. After the crack 14 is produced, the stress keeps acting until the tip of the crack 14 is extended transversely to the left side of the glue 12 to further destroy the glue 12, and finally the micro-nozzle nebulization plate 11 will fall off, and the life of the nebulization apparatus will be reduced.

In addition, TW Pat. No. 566339 discloses a supersonic amplifier device wherein a metal coating 22 is coated onto a joint interface of a piezoelectric driving device 21 first, and a melted liquid metal 24 is soldered between two corresponding connecting surfaces of a micro-nozzle nebulization plate 23, and the micro-nozzle nebulization plate 23 is attached. In FIG. 2, the micro-nozzle nebulization plate 23 packaged by the aforementioned method is a metal conductor, and the medium for connecting the micro-nozzle nebulization plate 23 and the piezoelectric driving device 21 is also a liquid metal. After an electric connection, the micro-nozzle nebulization plate 23 is electrically connected to the piezoelectric driving device 21 and becomes an electrically charged metal conductor. Since the nebulization apparatus is situated at an operating environment of high temperature and high moisture, a short circuit of the piezoelectric driving device 21 driven by electric power may result easily in such operating environment, and the metal coating 22 on the surface of the piezoelectric driving device 21 will be burned or fallen off due to the short circuit, such that the piezoelectric driving device 21 no longer has the high frequency vibration function or even causes an electric shock or a fire.

After the micro-nozzle nebulization plate 23 is electrically connected and operated at the liquid surface, an electrically charged metal conductor produces an electrolysis in the liquid. If the liquid is used for the purpose of a medical treatment and doped with medicine, the electrolysis will have an electrochemical action with the micro-nozzle nebulization plate and the medicine, and change the properties of the medicine. As a result, the expected effect of the medical treatment will be affected, or even worse, a substance harmful to human bodies may be produced.

In addition, TW Pat. No. I252130 discloses a water draft structure of a high-frequency nebulization apparatus as shown in FIG. 3, and the nebulization apparatus includes a nebulization unit 31 and a floating unit 32. The nebulization unit 31 is connected onto a carrier 321 of a floating unit 32. The carrier 321 floats at a liquid level 331 of a working liquid 33 in a container 34, and a micro-nozzle nebulization plate 311 is close to the horizontal position of the liquid level. The overall structure is carried at the surface of the working liquid 33 by the carrier 321, such that the nebulization unit 31 maintains a specific mass action at the liquid level to maximize a quantitative nebulization power. With the limitation of the material properties of the floating unit 32, the vibration performance of the nebulization unit 31 will be restricted if the floating unit 32 is made of a rigid material. If the floating unit 32 is made of an elastic material, the vibration of the exciting unit will be absorbed, and thus the nebulization efficiency of the nebulization apparatus will be poor.

If the aforementioned nebulization apparatus is situated at a working environment of being submerged into the liquid or at a working environment with high moisture, water or moisture will cause a short circuit to the nebulization unit since the nebulization unit is not wrapped by any water-resisting structure.

In summation of the description above, the conventional nebulization apparatuses do not have any water-resisting structure for protecting the piezoelectric driving device, and thus short circuits may result easily and the life of the nebulization apparatus will be reduced.

SUMMARY OF THE INVENTION

It is a primary objective of the present invention to provide a nebulization apparatus with a packaging and fixing structure to overcome the shortcomings of the prior art that the nebulization apparatus may be short circuited easily, and the nebulization effect cannot be maximized, or electric shocks may occur due to the electric leakage of the liquid.

To achieve the foregoing objective, the present invention provides a nebulization apparatus with a packaging and fixing structure, and the apparatus comprises a piezoelectric driving device, an adhesive agent, a nebulization plate, a packaging layer and a fixing base. A ditch is disposed at an end of the piezoelectric driving device for filling the adhesive agent. The nebulization plate is installed at the ditch and fixed to the driving device by the adhesive agent. The packaging layer is covered onto the piezoelectric driving device. The fixing base is fixed to the piezoelectric driving device.

Preferably, the packaging layer is made of a polymer material.

Another objective of the present invention is to provide a nebulization apparatus with a packaging and fixing structure, and the apparatus comprises a piezoelectric driving device, a nebulization plate, an insulating plate, a bonding agent, a packaging layer and a fixing base. The nebulization plate is installed at a side of the piezoelectric driving device. The insulating plate is insulted between the piezoelectric driving device and the nebulization plate. The bonding agent is combined with the piezoelectric driving device, the insulating plate and the nebulization plate. The packaging layer is covered onto the piezoelectric driving device. The fixing base is fixed to the piezoelectric driving device.

Preferably, the insulating plate is made of a fiberglass composite material, but not limited to such arrangement only.

In summation of the description above, the nebulization apparatus with a packaging and fixing structure in accordance with the present invention has one or more of the following advantages:

(1) The nebulization apparatus can improve the connecting strength of the piezoelectric driving device and the nebulization plate to extend the life of the nebulization apparatus.

(2) The nebulization apparatus has a packaging layer covered onto the piezoelectric driving device to prevent short circuits caused by the electric contact of the piezoelectric driving device with the liquid.

(3) The nebulization apparatus has a packaging layer covered onto the piezoelectric driving device, such that the packaging layer will not absorb vibration energies or suppress vibrations of the piezoelectric driving device, and the packaging layer can be contained in any fixing base.

BRIEF DESCRIPTION OF THE DRAWINGS

The subject matter regarded as the invention is particularly pointed out and distinctly claimed in the concluding portion of the specification. The invention together with features and advantages thereof may best be understood by reference to the following detailed description with the accompanying drawings in which:

DETAILED DESCRIPTION OF THE PREFERRED EMBODIMENTS

The present invention relates to a nebulization apparatus with a packaging and fixing structure. While the specifications describe at least one embodiment of the invention considered best modes of practicing the invention, it should be understood that the invention can be implemented in many ways and is not limited to the particular examples described below or to the particular manner in which any features of such examples are implemented.

Figure 1:
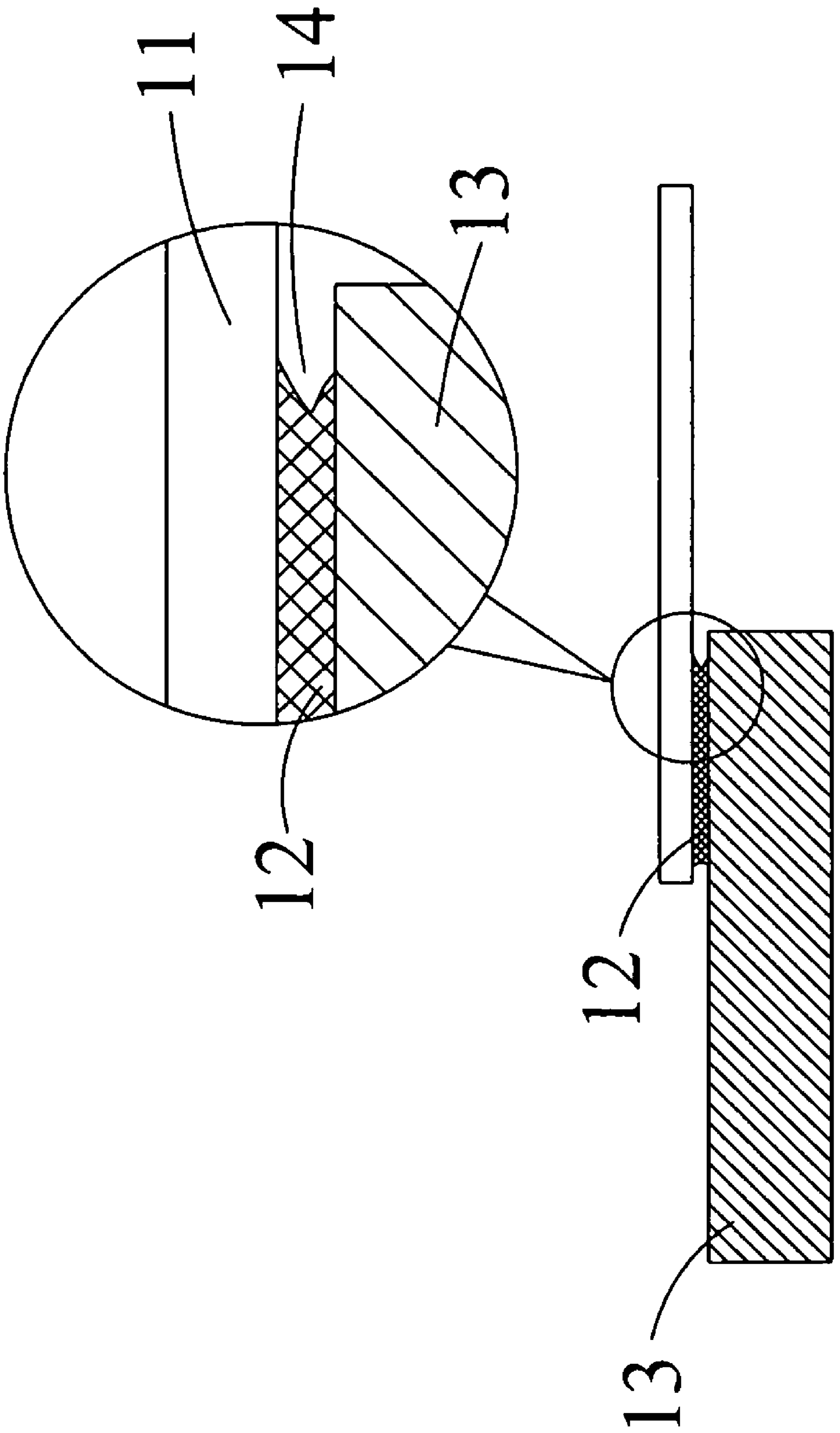
FIG.1(PRIOR ART)
FIG. 1 is a first schematic view of a conventional nebulization apparatus.
Figure 2:
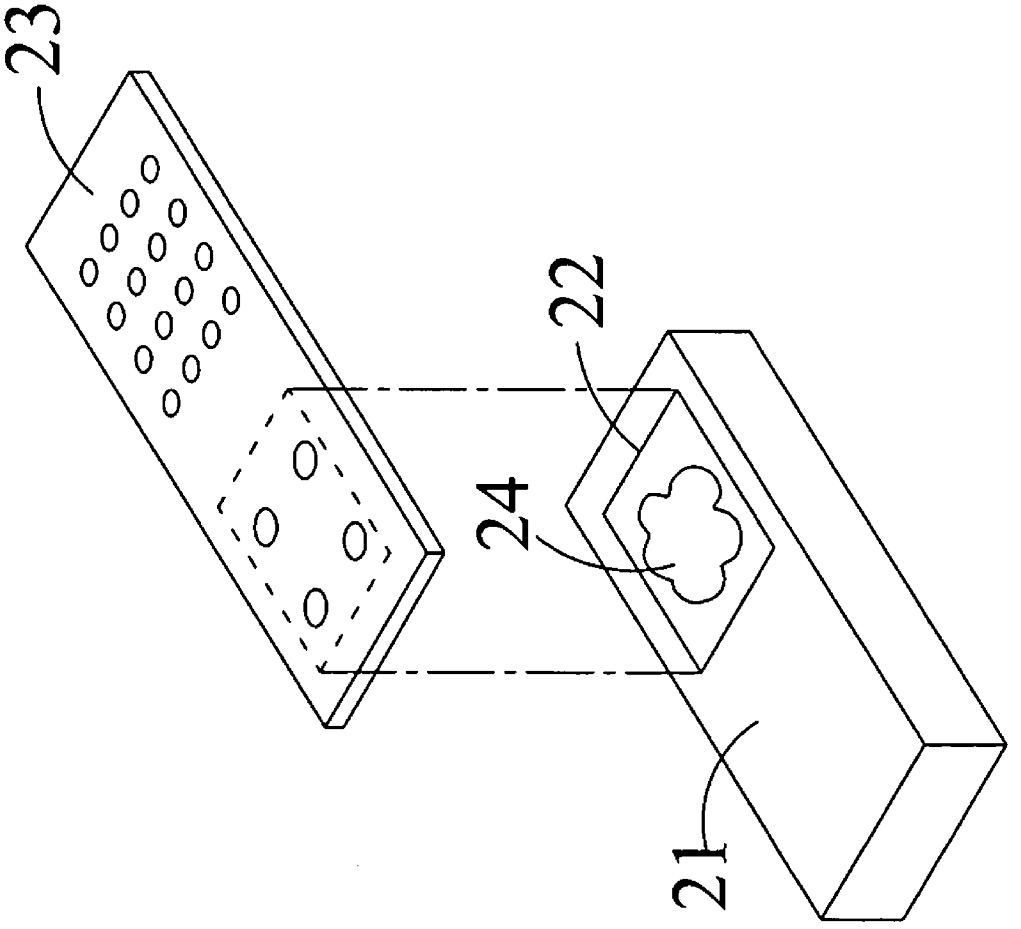
FIG.2(PRIOR ART)
FIG. 2 is a second schematic view of a conventional nebulization apparatus.
Figure 3:
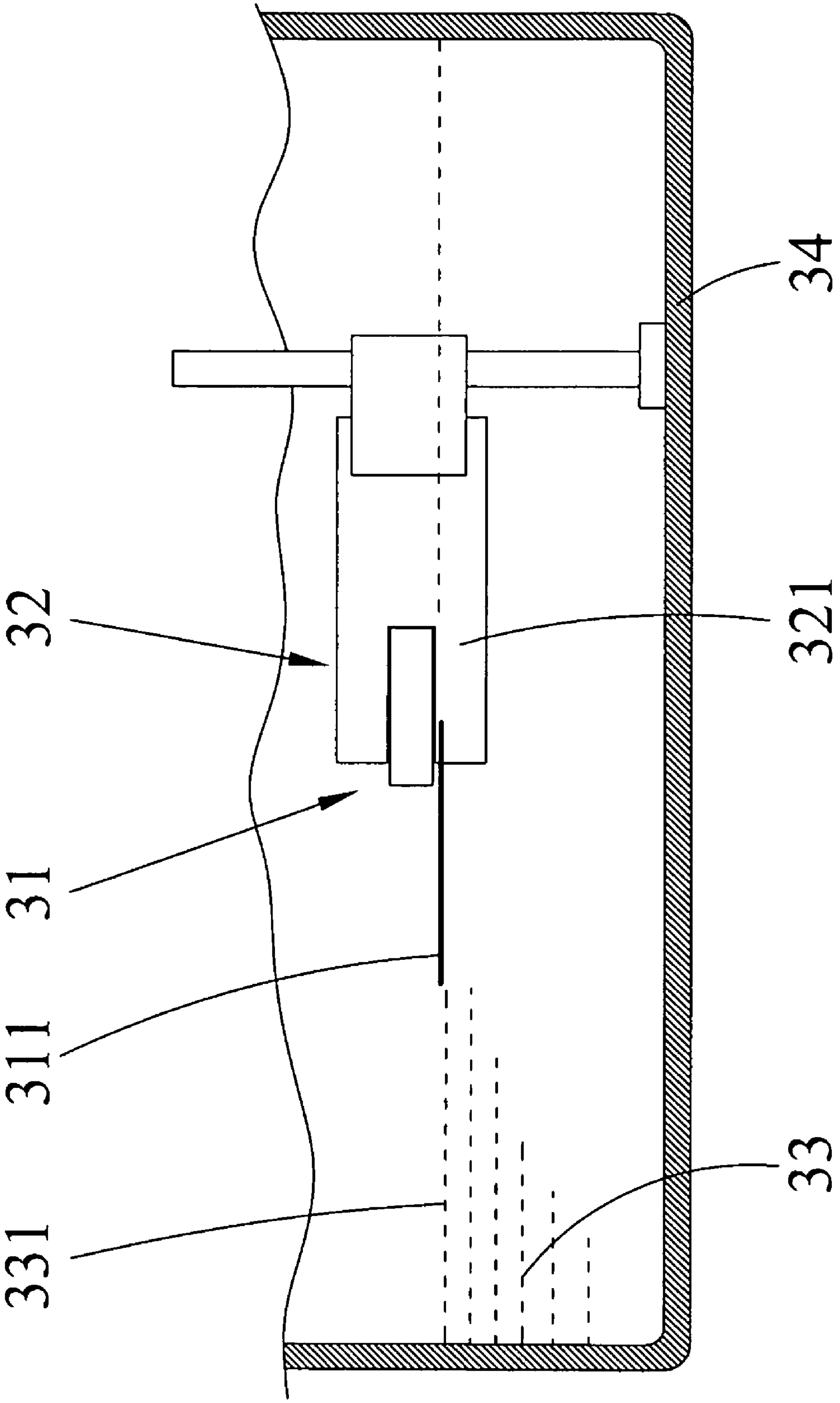
FIG.3(PRIOR ART)
FIG. 3 is a third schematic view of a conventional nebulization apparatus.
Figure 4:
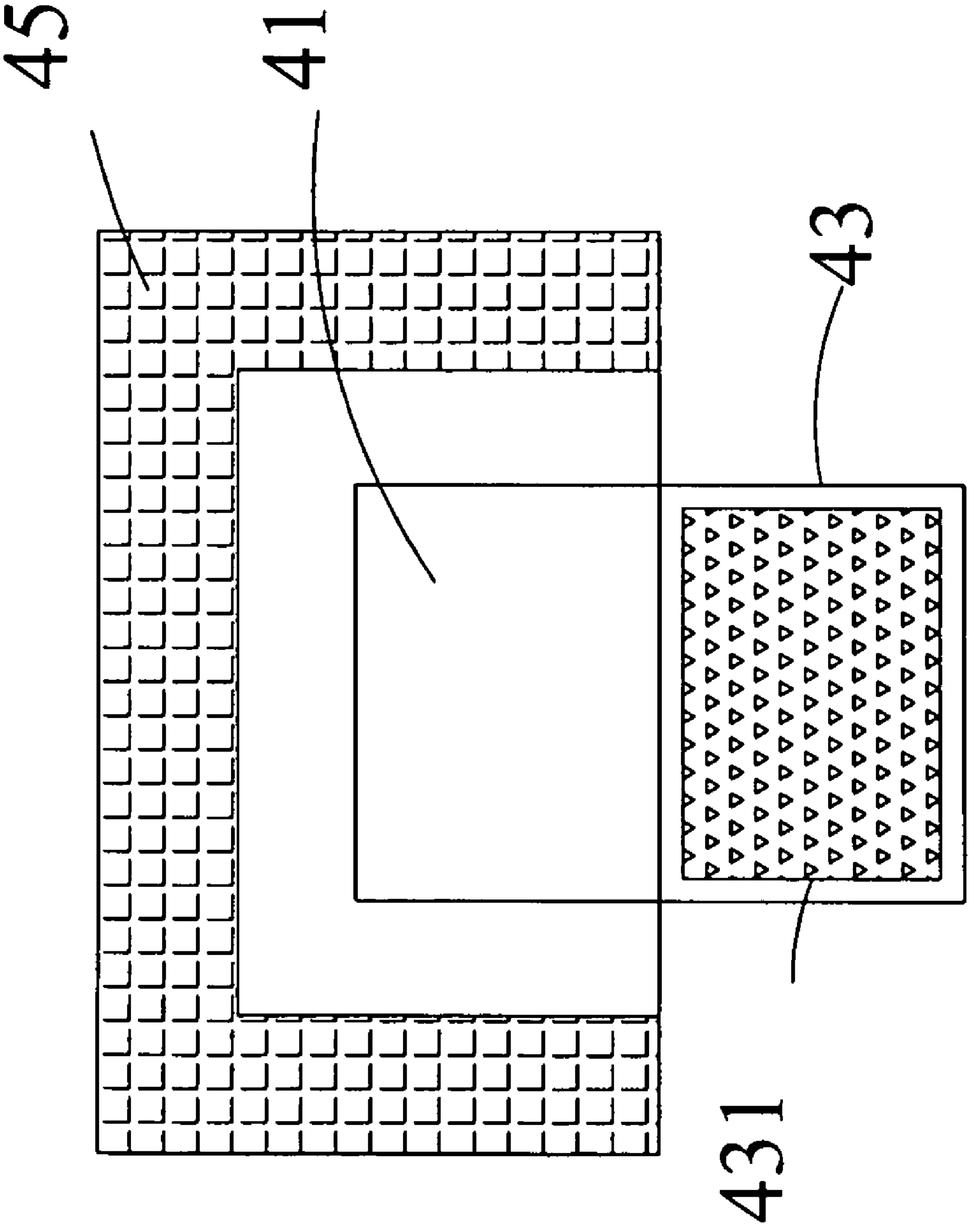
FIG. 4 is a top view of a nebulization apparatus with a packaging and fixing structure in accordance with a first preferred embodiment of the present invention.
Figure 5:
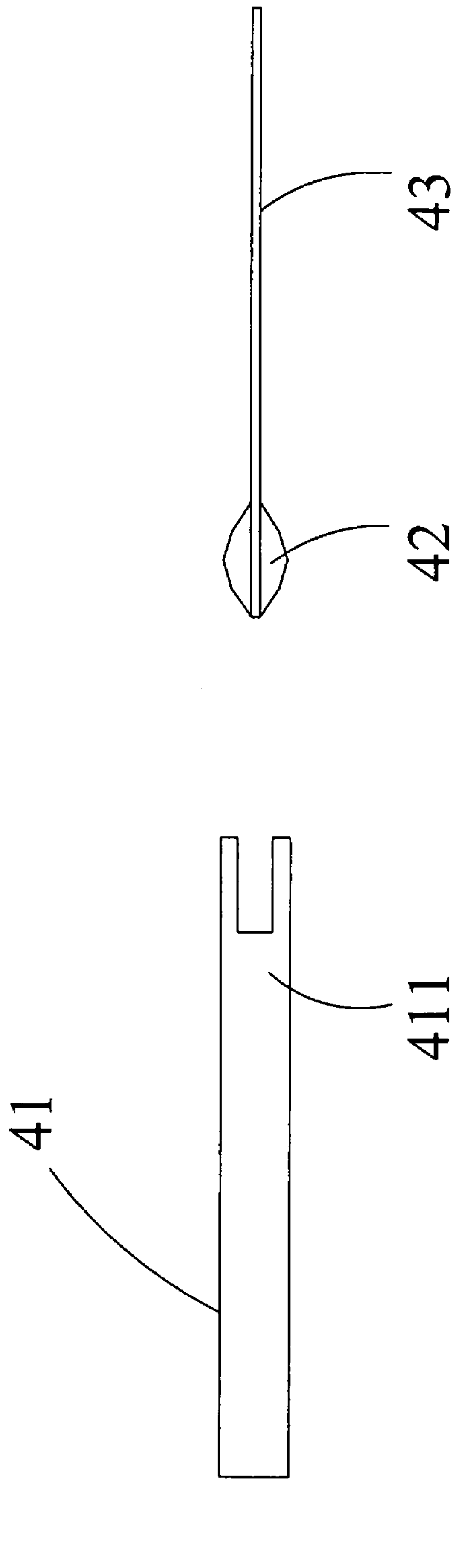
FIG. 5 is a first cross-sectional view of a nebulization apparatus with a packaging and fixing structure in accordance with a first preferred embodiment of the present invention.
Figure 6:
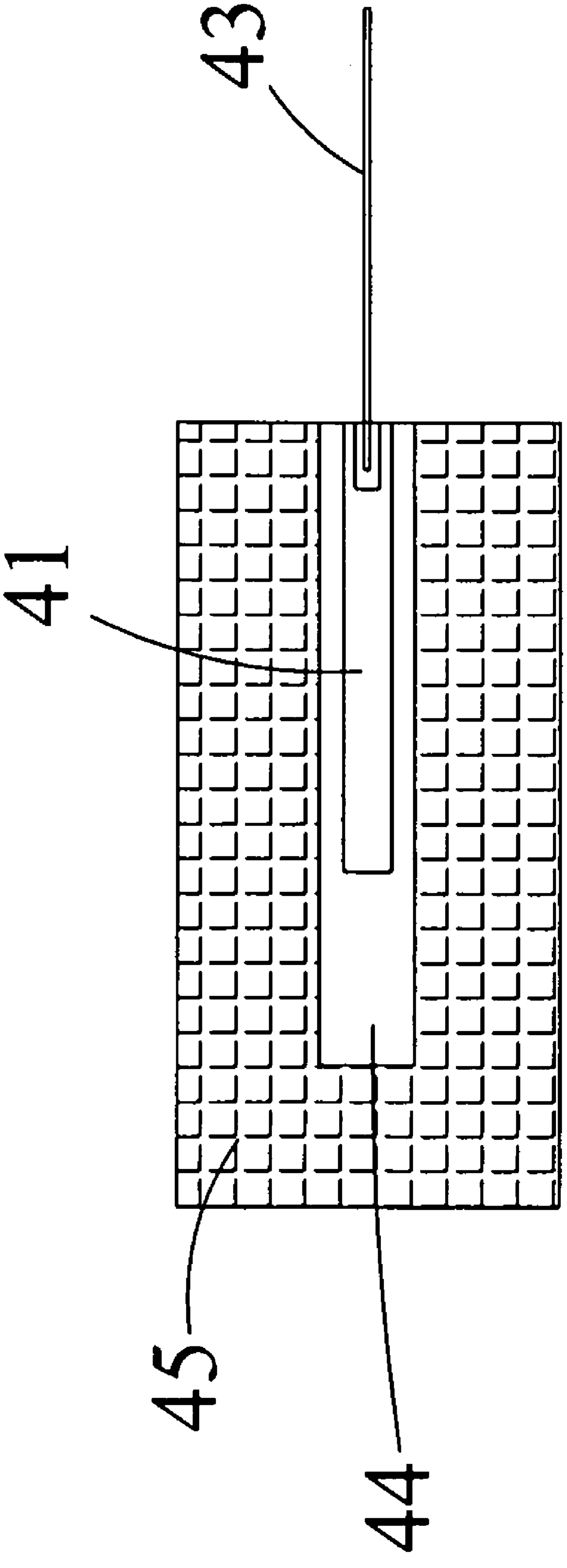
FIG. 6 is a second cross-sectional view of a nebulization apparatus with a packaging and fixing structure in accordance with a first preferred embodiment of the present invention.

FIG. 4, FIG. 5 and FIG. 6 illustrate a top view and cross-sectional views of a nebulization apparatus with a packaging and fixing structure in accordance with a first preferred embodiment of the present invention respectively. The nebulization apparatus is located in a liquid (not shown in the figure) and comprises a piezoelectric driving device 41, an adhesive agent 42, a nebulization plate 43, a packaging layer 44 and a fixing base 45.

Preferably, the piezoelectric driving device 41 is a flat plate made of a quartz or ceramic material. An end of the piezoelectric driving device 41 has a ditch 411. The working principle of the piezoelectric driving device 41 is to supply an alternate current (AC) to a conductive layer (not shown in the figure) disposed on both sides of the piezoelectric driving device 41, such that the piezoelectric driving device 41 will be expanded and contracted repeatedly due to a change of electric field of the conductive layer caused by the AC, so as to generate vibrations. The adhesive agent 42 is filled in the ditch 411. The nebulization plate 43 has a plurality of micro holes 431, and an end of the nebulization plate 43 is installed at the ditch 411 and fixed to the piezoelectric driving device 41 by the adhesive agent 42. The nebulization plate 43 is driven by the piezoelectric driving device 41 to strike a water film at a liquid level to make the liquid pass through the micro holes to form a mist. With such packaging method, the attaching strength of the piezoelectric driving device 41 and the nebulization plate 43 can be enhanced to extend the life of the nebulization apparatus. In addition, the adhesive agent 42 is made of an insulating material such as epoxy resin, but not limited to such arrangement only. As a result, the piezoelectric driving device 41 will not conduct electricity to the nebulization plate 43, so that any electrochemical action between the liquid and the nebulization plate 43 or any electric leakage in the liquid can be prevented.

After the nebulization plate 43 is installed at the ditch 411, the packaging layer 44 is covered onto the piezoelectric driving device 41. Since the packaging layer 44 has a water-resisting property for isolating water vapors and moisture from the piezoelectric driving device 41 as well as preventing the conductive layer of the piezoelectric driving device 41 from being burned or falling off due to the heat or moisture of the operating environment of high temperature and high moisture, and the packaging layer 44 has an electrically insulating property for protecting the solder point of the circuit on the piezoelectric driving device 41, such that the piezoelectric driving device 41 is electrically insulated from the liquid to prevent short circuits and extend the life of the nebulization apparatus. Preferably, the packaging layer 44 is made of a polymer material such as silicone, latex or rubber, but not limited to such arrangement only, and the polymer material has a property falling between a soft material and a hard material, and thus does not absorb excessive vibrations produced by the piezoelectric driving device 41 due to a too-soft material that may affect the nebulization efficiency, or the piezoelectric driving device 41 may collide and hit other connected objects due to a too-hard material that may affect the vibration performance, and the piezoelectric driving device 41 can be fixed to a support fixing base in any shape.

Figure 7:
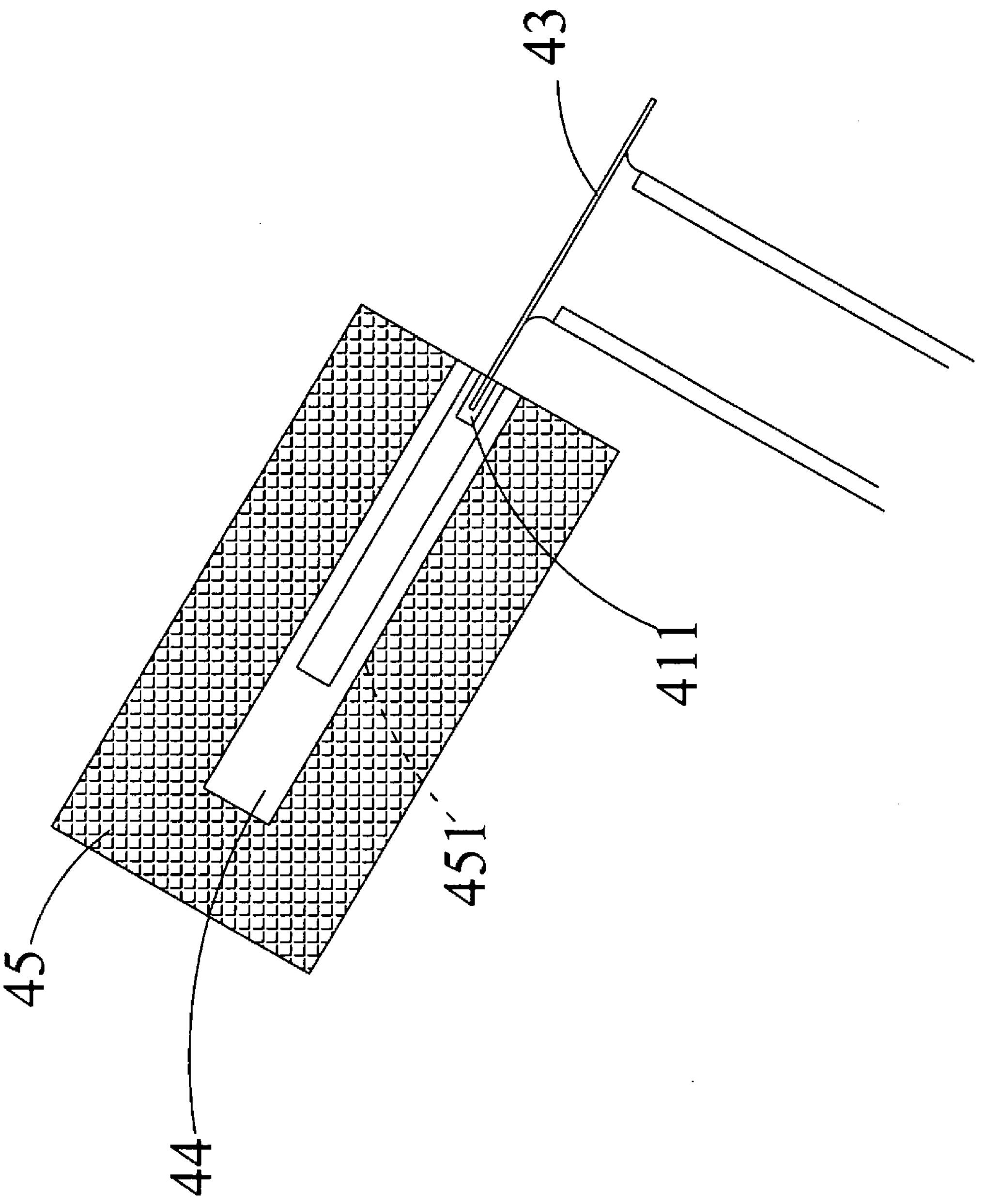
FIG. 7 is a cross-sectional view of a nebulization apparatus with a packaging and fixing structure being inclined at a water surface in accordance with the present invention.

Preferably, the fixing base 45 is made of a hard material and can be in a rectangular, circular or elliptical shape. The fixing base 45 has a containing space 451 for containing the piezoelectric driving device 41 and the packaging layer 44, such that the piezoelectric driving device 41 can be fixed into the fixing base 45. Since the piezoelectric driving device 41 is covered onto the packaging layer 44 with an appropriate hardness, the piezoelectric driving device 41 can be fixed and contained in the fixing base 45 without being suppressed by the fixing base 45 or affecting the vibration performance. The fixing base 45 may be turned to an angle of 0 to 90 degrees depending on the actual requirements or environmental factors, such that the nebulization plate 43 in inclined at the horizontal surface. With this structural design, the nebulization direction can be adjusted, and the mist is prevented from being condensed into a water film on the nebulization plate 43 that will lower the nebulization ability as shown in FIG. 7.

Figure 8:
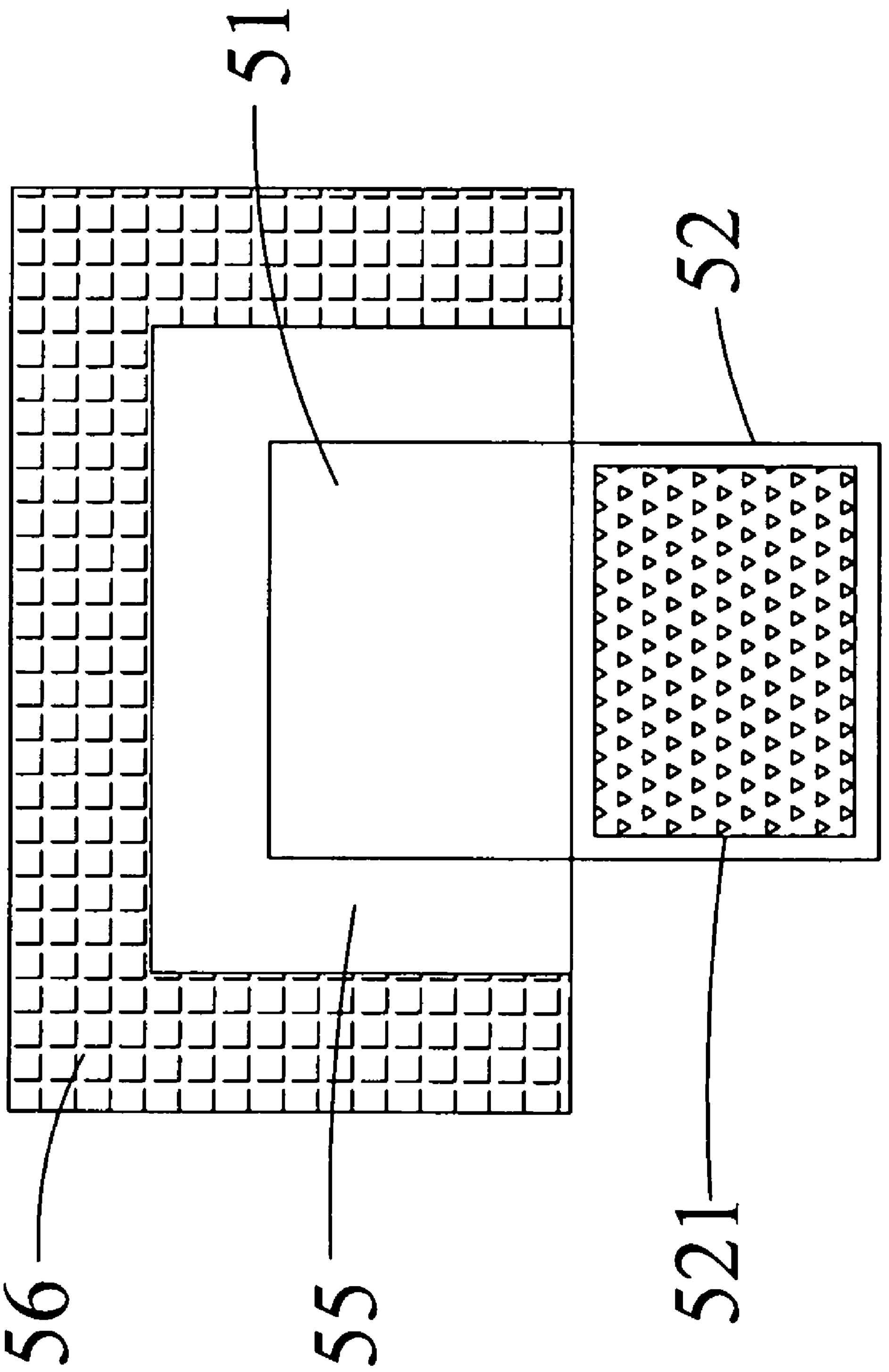
FIG. 8 is a schematic view of a nebulization apparatus with a packaging and fixing structure in accordance with a second preferred embodiment of the present invention.
Figure 9:
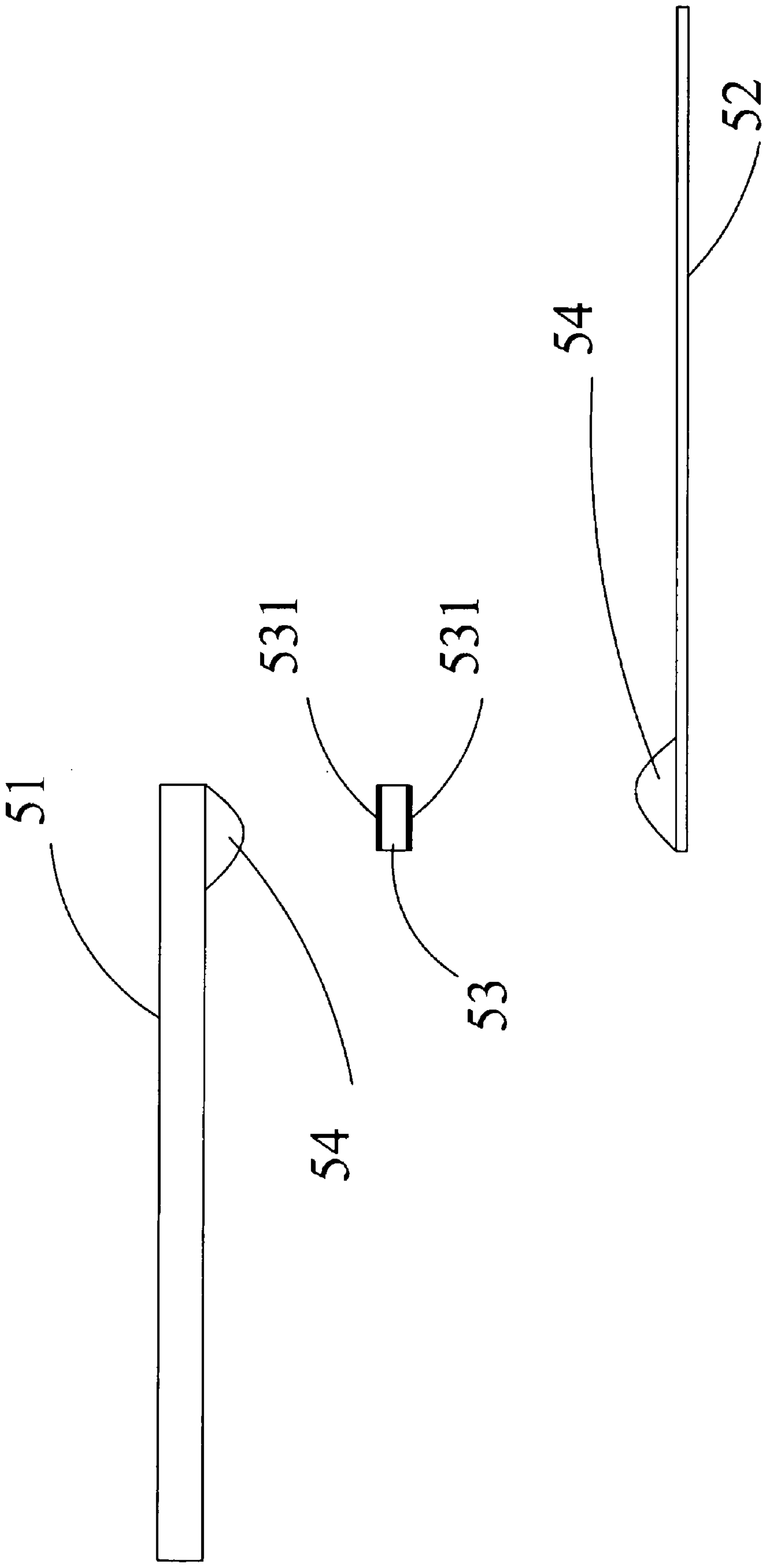
FIG. 9 is a first cross-sectional view of a nebulization apparatus with a packaging and fixing structure in accordance with a second preferred embodiment of the present invention.
Figure 10:
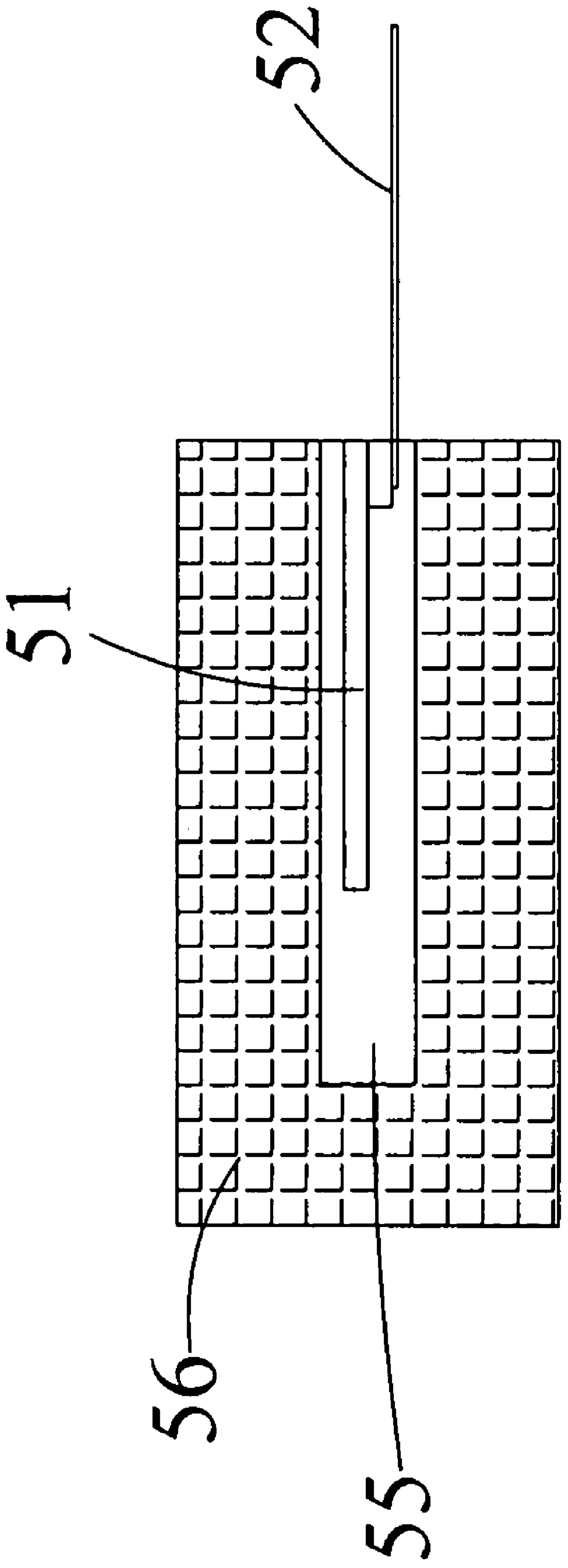
FIG. 10 is a second cross-sectional view of a nebulization apparatus with a packaging and fixing structure in accordance with a second preferred embodiment of the present invention.

FIG. 8, FIG. 9 and FIG. 10 illustrate a top view, a first cross-sectional view and a second cross-sectional view of a nebulization apparatus with a packaging and fixing structure in accordance with a second preferred embodiment of the present invention respectively. The nebulization apparatus comprises a piezoelectric driving device 51, a nebulization plate 52, an insulating plate 53, a bonding agent 54, a packaging layer 55 and a fixing base 56. The nebulization plate 52 includes a plurality of micro holes 521 disposed thereon, particularly on a side of the piezoelectric driving device 51. In this embodiment, the structure and function of the piezoelectric driving device 51, the nebulization plate 52, the packaging layer 55 and the fixing base 56 are the same as the first preferred embodiment, and thus will not be described here again.

The difference of this preferred embodiment from the first preferred embodiment resides on that a metal conductive layer 531 is disposed separately on both sides of the insulating plate 53, and the insulating plate 53 is installed between the piezoelectric driving device 51 and the nebulization plate 52, and the insulating plate 53 is made of a rigid material incapable of absorbing vibrations easily, such as a fiberglass composite material. The bonding agent 54 is used for attaching the piezoelectric driving device 51, the insulating plate 53 and the nebulization plate 52, and the bonding agent 54 is a solder paste, and the solder paste is soldered with the metal conductive layer 531 by sending the solder paste in a high-temperature furnace and through a high-temperature soldering process. The insulating plate 53 is attached to the piezoelectric driving device 51 and the nebulization plate 52 to overcome the issue of insufficient attaching strength of simply attaching the micro-nozzle nebulization plate with the piezoelectric driving device of the nebulization apparatus by a glue, and the insulating plate 53 can isolate the nebulization plate 52 from the piezoelectric driving device 51 electrically to prevent any electrochemical action between the nebulization plate 51 and the liquid or any electric leakage in the liquid.

Figure 11:
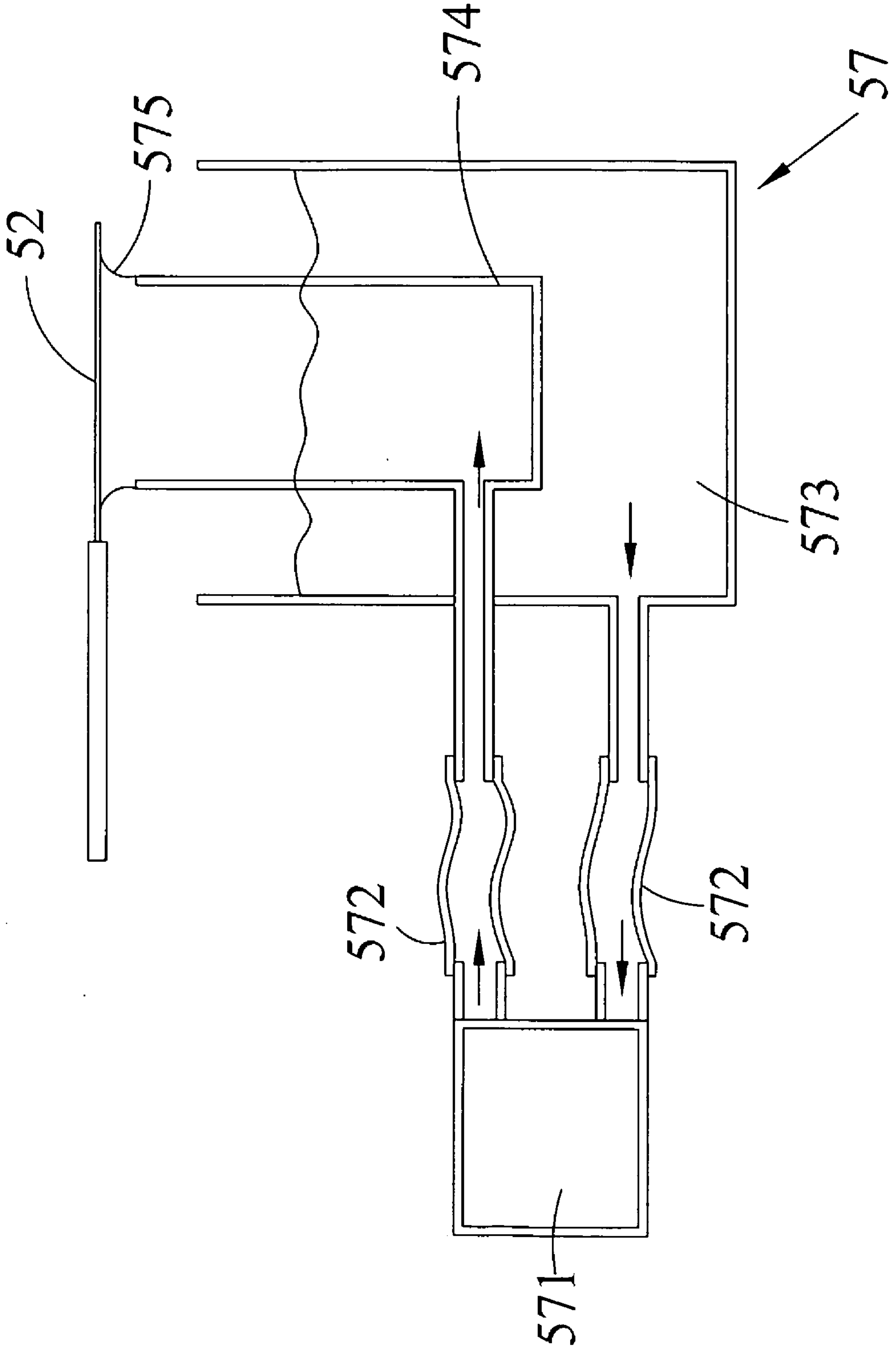
FIG. 11 is a schematic view of a water supply by an active water supply structure of a nebulization apparatus with a packaging and fixing structure in accordance with the present invention.

To stabilize the nebulization speed of the nebulization plate, the nebulization apparatus with a packaging and fixing structure of the invention further comprises an active water supply structure 57 as shown in FIG. 11. The active water supply structure 57 includes a pump 571, a plurality of guide flow passages 572, a first water tank 573 and a second water tank 574. The pump 571 and the guide flow passages 572 are provided for stabilizing the liquid level 575 of the second water tank 574, such that the nebulization plate 52 can nebulize the liquid with a uniform speed without a sudden acceleration or retardation of the nebulization speed due to a rise or a drop of the liquid level.

In summation of the description above, the nebulization apparatus with a packaging and fixing structure of the invention has an effect of extending the life of the nebulization apparatus by installing the piezoelectric driving device at the ditch and coating the adhesive agent onto the piezoelectric driving device, such that the piezoelectric driving device can be clamped by both sides of the nebulization plate without falling off easily. In addition, the adhesive agent is made of an electric insulating material, so that the nebulization plate will not be electrically conducted and any electrochemical action of the liquid can be avoided to prevent a change of chemical properties of the medicine, or any electric leakage in the liquid.

The nebulization apparatus with a packaging and fixing structure of the invention has an effect of extending the life of the nebulization apparatus by soldering the insulating plate to the piezoelectric driving device and the nebulization plate, not only enhancing the strength of attaching the piezoelectric driving device with the nebulization plate, but also electrically insulating the nebulization plate from the piezoelectric driving device to prevent any electrochemical action between the nebulization plate and the liquid or a change of chemical properties of the medicine, or an electric leakage. The insulating plate is made of a weak elastic material, and thus it will not absorb much vibration produced by the piezoelectric driving device that may affect the nebulization effect.

The nebulization apparatus with a packaging and fixing structure of the invention further has another effect of preventing short circuits caused by an electric contact of the piezoelectric driving device with the liquid by installing a water-resisting packaging layer covered onto the piezoelectric driving device.

The nebulization apparatus with a packaging and fixing structure of the invention further provides a packaging layer with an appropriate hardness to prevent absorbing too much vibration energy of the piezoelectric driving device due to a too-soft material of the packaging layer or suppressing the vibration of the piezoelectric driving device due to a too-hard material of the packaging layer.

What is claimed is:

1. A nebulization apparatus with a packaging and fixing structure, comprising:

a piezoelectric driving device, having a ditch disposed at one end of the piezoelectric driving device, wherein the ditch is located between an upper surface and bottom surface of the piezoelectric driving device;

an adhesive agent, filled into the ditch of the piezoelectric driving device;

a nebulization plate, with one end installed at the ditch of the piezoelectric driving device and fixed into the piezoelectric driving device by the adhesive agent, and another end opposite to the end fixed into the piezoelectric driving device being a vibrating end;

a packaging layer, for covering the piezoelectric driving device; and a fixing base, for fixing the piezoelectric driving device.

2. The nebulization apparatus with a packaging and fixing structure of claim 1, wherein the packaging layer is made of a polymer material incapable of absorbing vibration energy of the piezoelectric driving device or suppressing the vibration ability of the piezoelectric driving device.

3. The nebulization apparatus with a packaging and fixing structure of claim 2, wherein the polymer material has a water-resisting property and an insulating property for preventing short-circuit caused by an electric contact of the piezoelectric driving device with the liquid.

4. The nebulization apparatus with a packaging and fixing structure of claim 2, wherein the polymer material is silicone, latex or rubber.

5. The nebulization apparatus with a packaging and fixing structure of claim 1, wherein the adhesive agent is epoxy resin.

6. The nebulization apparatus with a packaging and fixing structure of claim 1, wherein the fixing base is capable of driving the piezoelectric driving device to rotate to an angle for enhancing the nebulization effect of the nebulization plate.

7. The nebulization apparatus with a packaging and fixing structure of claim 1, wherein the fixing base has a containing space for containing the piezoelectric driving device and the packaging layer.

8. The nebulization apparatus with a packaging and fixing structure of claim 1, wherein the nebulization plate has a plurality of micro holes, and the nebulization plate is driven to strike a water film at a liquid level to make the liquid pass through the micro holes to form a mist.

9. The nebulization apparatus with a packaging and fixing structure of claim 1, further comprising an active water supply mechanism for stabilizing the water supply to the nebulization plate to stabilize the nebulization efficiency.

* * * * *